United States Patent [19]

Egami et al.

[11] 4,200,843

[45] Apr. 29, 1980

[54] NON-LINEAR OPERATIONAL CIRCUIT

[75] Inventors: Tsuneyuki Egami, Okazaki; Hisasi Kawai, Toyohashi; Tokio Kohama, Nishio; Hideki Obayashi, Aichi, all of Japan

[73] Assignee: Nippon Soken, Inc., Nishio, Japan

[21] Appl. No.: 865,114

[22] Filed: Dec. 28, 1977

[30] Foreign Application Priority Data

Feb. 25, 1977 [JP] Japan .................................. 52/20506

[51] Int. Cl.[2] .............................................. H03K 17/00

[52] U.S. Cl. .................................... 328/142; 307/229; 307/230; 307/360

[58] Field of Search ............... 307/229, 230, 350, 359, 307/360; 328/142

[56] References Cited

U.S. PATENT DOCUMENTS

| | | | |
|---|---|---|---|
| 3,612,912 | 10/1971 | Schwartz | 307/359 |
| 3,757,234 | 9/1973 | Ohlson | 328/142 |
| 4,017,742 | 4/1977 | James | 307/359 |
| 4,125,789 | 11/1978 | Van Schoiack | 307/230 |

*Primary Examiner*—Stanley D. Miller, Jr.
*Assistant Examiner*—B. P. Davis
*Attorney, Agent, or Firm*—Cushman, Darby & Cushman

[57] ABSTRACT

A non-linear operational circuit with reference voltage sources and switching means, wherein the output voltage of the operational circuit is compared with the reference voltages to open and close the switching means in accordance with their magnitudes relative to one another and thereby to non-linearly vary the output voltage of the operational circuit in response to changes in the input voltage. The reference voltage sources and the switching means are connected in series between the output terminal and the ground terminal of the operational circuit, whereby at the inflection point at which the ratio of the change in the output voltage of the operational circuit to the change in the input voltage changes, the output voltage is caused to change continuously.

4 Claims, 6 Drawing Figures

NON-LINEAR OPERATIONAL CIRCUIT

FIELD OF THE INVENTION

The present invention relates to non-linear operational circuits having a predetermined non-linear relationship between the input and the output, and more particularly the invention relates to a circuit having arbitrary inflection points and capable of possessing a desired input-output characteristic.

DETAILED DESCRIPTION

In a known type of non-linear operational circuit, such as one disclosed in Japanese Pat. No. 51-28486, the output voltage of the operational circuit changes in a step fashion at the inflection point of the operational circuit output.

Figure 1:
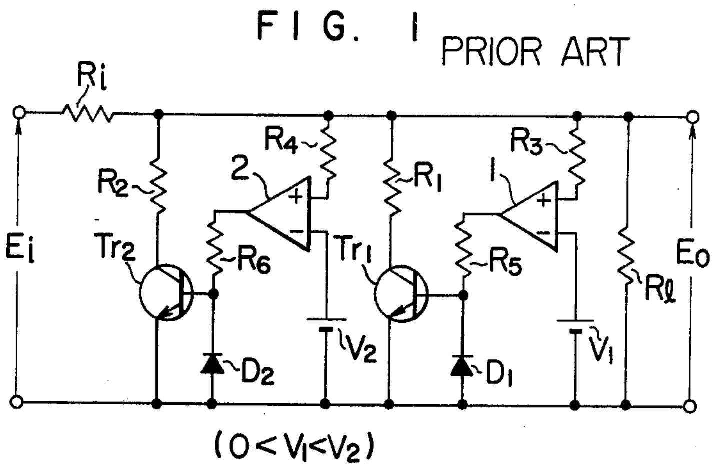
FIG. 1 PRIOR ART
FIG. 1 is a connection diagram of a prior art non-linear operational circuit.
Figure 2:
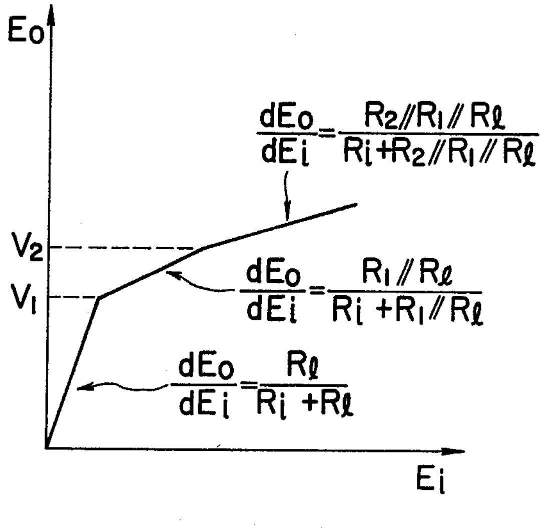
FIG. 2 PRIOR ART
FIG. 2 is an input-output characteristic diagram of the operational circuit shown in FIG. 1.

FIG. 1 illustrates one example of the prior art non-linear operational circuits disclosed in Japanese Pat. No. 51-28486, and FIG. 2 shows an input-output characteristic diagram of the operational circuit shown in FIG. 1.

In FIG. 1, symbol $E_i$ designates the input voltage, and $E_o$ the output voltage produced across a load resistor $R_l$ connected in series with an input resistor $R_i$. A series circuit comprising a resistor $R_1$ and an NPN transistor $Tr_1$ and another series circuit comprising a resistor $R_2$ and an NPN transistor $Tr_2$ are connected in parallel with the load resistor $R_l$ thus providing a pair of switching circuits. Numerals 1 and 2 designate amplifiers each having two input terminals of the polarities shown, e.g., linear ICs which respectively receive the output voltage $E_0$ as their one input through resistors $R_3$ and $R_4$ and also receive as their reference inputs bias voltages $V_1$ and $V_2$ having a relation $V_2 > V_1 > O$, thereby comparing the output voltage $E_0$ with the bias voltages $V_1$ and $V_2$, respectively. The outputs of the amplifiers 1 and 2 are respectively connected to the bases of the transistors $Tr_1$ and $Tr_2$ through base current limiting resistors $R_5$ and $R_6$, so that the transistors $Tr_1$ and $Tr_2$ are turned on and off in response to the outputs of the amplifiers 1 and 2 so as to control the respective switching circuits. Symbols $D_1$ and $D_2$ designate diodes of the polarities shown, whereby when a forward voltage is applied to the diodes $D_1$ and $D_2$, the base-emitter sections of the transistors $Tr_1$ and $Tr_2$ are short-circuited.

With the construction shown in FIG. 1, assuming that $E_{01}$ represents the value of the output voltage $E_0$ just prior to attaining the bias voltage $V_1$, it is given by $E_{01} = (R_l/R_i + R_l)\ E_i$, since the transistor $Tr_1$ is off, and also assuming that $E_{02}$ represents the value of the output voltage $E_0$ attaining the bias voltage $V_1$, then it is given by $$E_{02} = \frac{R_1//R_l}{R_i + R_1//R_l} E_i,$$

since the transistor $Tr_1$ is turned on and the resistor $R_1$ is operative in the voltage dividing circuit. Here, $R_1//R_l$ represents the resistance of the circuit including parallel connected resistors $R_1$ and $R_l$. Since $$R_1//R_l = \frac{R_1 R_l}{R_1 + R_2},$$

we obtain $$E_{02} = \frac{R_l}{\frac{(R_1 + R_l)R_i}{R_1} + R_l} E_i$$

and consequently a relation $E_{01} = E_{02}$ does not hold unless $R_l = 0$. As a result, when the output voltage $E_0$ reaches the bias voltage $V_1$, the output voltage $E_0$ changes in a step fashion and the output voltage cannot change continuously. In other words, with the characteristic curve of FIG. 2, the output voltage $E_0$ changes in a step fashion and becomes discontinuous at the inflection point at which the value of the gain $dE_0/dE_i$ changes.

The present invention is intended to overcome the above-mentioned deficiency in the prior art, namely, the output voltage of a non-linear operational circuit is caused to change continuously and not in a step fashion at the inflection point of the output voltage.

In accordance with the present invention, there is provided a non-linear operational circuit wherein a series circuit including a resistor, an analog switch and a reference voltage source is connected between an output terminal and a ground terminal, and the analog switch is opened and closed by a comparator adapted to receive the associated reference voltage as its reference input, thus, preventing the characteristic curve from deviating at around the inflection point of the output voltage at the output of the operational circuit and thereby providing a desired continuous non-linear input-output characteristic. The non-linear operational circuit may include a plurality of the series circuits as occasion demands.

It is therefore the object of this invention to provide a non-linear operational circuit which overcomes the foregoing deficiency of the prior art, namely, deviation of the output voltage characteristic curve at around the inflection point on the curve and thereby ensuring any desired input-output characteristic.

Now, preferred embodiments of the present invention will be described with reference to the accompanying drawings.

Figure 3:
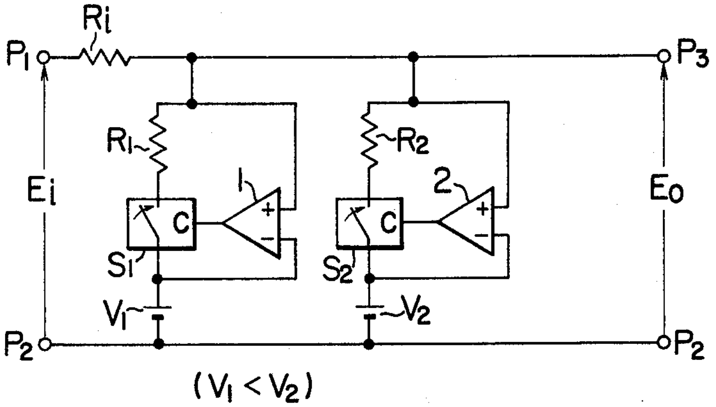
FIG. 3 is a connection diagram showing an embodiment of a non-linear operational circuit according to the present invention.

Referring to FIG. 3 showing a first embodiment of the invention, symbol $E_i$ designates the input voltage, and $E_0$ the output voltage generated through an input resistor $R_i$. A series conduit comprising a resistor $R_1$, an analog switch $S_1$ (e.g., the RCA IC CD4066) and a reference voltage source $V_1$ and a similar series circuit comprising a resistor $R_2$, an analog switch $S_2$ and a reference voltage source $V_2$ are connected between an output terminal $P_3$ and a ground terminal $P_2$ thus providing first and second switching circuits. Numerals 1 and 2 designate comparators (e.g., the Motorola IC MC3302) each having two input terminals of the polarities shown and designed to receive as their one input the voltage at the output terminal $P_3$ and as their reference inputs reference voltages $V_1$ and $V_2$ having a relation $0<V_1<V_2$ so as to compare the output voltage $E_0$ with the reference voltages $V_1$ and $V_2$, respectively. The outputs of the comparators 1 and 2 are respectively connected to the control terminal C of the analog switches $S_1$ and $S_2$, so that in response to the outputs of the comparators 1 and 2, the analog switches $S_1$ and $S_2$ are opened and closed to control the associated switching circuits. Here, the like reference numerals are used to designate the input resistor, the resistors connected in series with the analog switches, etc., which correspond to the counterparts in FIG. 1.

With the construction described above, the operation and characteristic of the first embodiment circuit will now be described with reference to FIG. 4.

In the Figure, when $$E_0 \leqq V_1 \quad (1)$$

since the outputs of the comparators 1 and 2 are both at a low level (hereinafter simply designated by a logical symbol "0") and thus both of the analog switches $S_1$ and $S_2$ are off, the resulting gain is given by $$dE_0/dE_i = 1.$$

On the other hand, when $$V_1 < E_0 \leqq V_2 \quad (2)$$

since the output of the comparator 1 is at a high level (hereinafter simply designated by a logical symbol "1") and the output of the comparator 2 is at "0" thus turning the analog switch $S_1$ on and the analog switch $S_2$ off, the resulting gain is given by $$\frac{dE_0}{dE_i} = \frac{R_1}{R_i + R_1}$$

Further, when $$V_2 < E_0 \quad (3)$$

since the outputs of comparators 1 and 2 are both at "1" and consequently the analog switches $S_1$ and $S_2$ are both turned on, the resulting gain is given by $$\frac{dE_o}{dE_i} = \frac{R_1//R_2}{R_i + R_1//R_2}$$

where $R_1//R_2$ is the combined resistance of the resistors $R_1$ and $R_2$ when connected in parallel.

Figure 4:
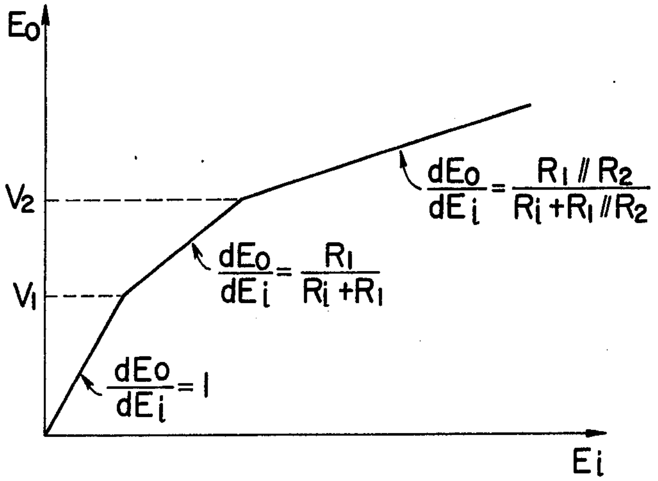
FIG. 4 is an input-output characteristic diagram of the operational circuit shown in FIG. 3.

Since a relation $$1 > \frac{R_1}{R_i + R_1} > \frac{R_1//R_2}{R_i + R_1//R_2}$$

always holds among the gains in the above cases (1), (2) and (3), as shown in FIG. 4, the circuit shown in FIG. 3 has an input-output characteristic with a gradually descreasing gain. It is to be noted that the number of inflection points on the input-output characteristic may assume any given value greater than 1 depending on the number of switching circuits.

With the circuit construction shown in FIG. 3, we obtain $E_{01}=E_i$ just prior to the point of the output voltage $E_0$ attaining the reference voltage $V_1$, and at the point of the output voltage $E_0$ attaining the reference voltage $V_1$, we obtain $$E_{02} = \frac{R_1E_i + R_iV_1}{R_1 + R_i}$$

from the equation $$\frac{E_i - E_{02}}{R_i} = \frac{E_{02} - V_1}{R_1}.$$

Here, since $E_{02}=V_1$, we obtain $E_{02}=E_i$. If a load resistor is connected between the output terminals $P_2$ and $P_3$, this will only cause a change in the gain $dE_0/dE_i$ and consequently there will be no danger of the outputs voltage $E_0$ being changed in a step fashion at the inflection point.

Figure 5:
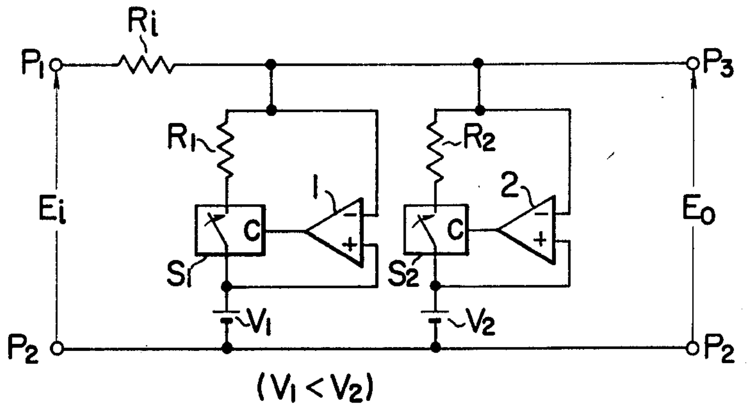
FIG. 5 is a connection diagram showing a second embodiment of the circuit according to the invention.
Figure 6:
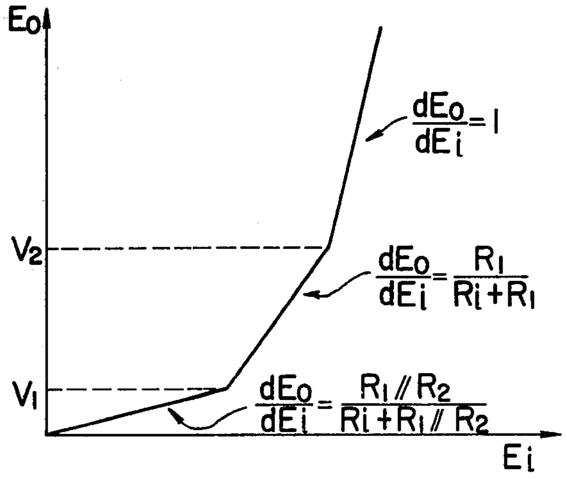
FIG. 6 is an input-output characteristic diagram of the operational circuit shown in FIG. 5.

On the other hand, with the second embodiment shown in FIG. 5, which is almost identical in construction with the first embodiment of FIG. 3 and in which the like component parts are designated by the like reference numerals as in FIG. 3, the input-output characteristic shown in FIG. 6 is obtained.

The embodiment of FIG. 5 differs from the circuit shown in FIG. 3 in that the polarities of the two input terminals of the comparators 1 and 2 are reversed. With the circuit shown in FIG. 5, as in the case of the circuit of FIG. 3, the analog switches $S_1$ and $S_2$ are opened and closed in accordance with the output voltage $E_0$.

In other words, when $$E_0 \leqq V_1 \quad (4)$$

the analog switches $S_1$ and $S_2$ are both turned on and consequently the resulting gain is given by $$\frac{dE_0}{dE_i} = \frac{R_1//R_2}{R_i + R_1//R_2}.$$

When $$V_1 < E_0 - V_2 \quad (5)$$

the analog switch $S_1$ is turned off and the analog switch $S_2$ is turned on and consequently the resulting gain is driven by $$\frac{dE_0}{dE_i} = \frac{R_1}{R_i + R_1}$$

Further, when $$V_2 < E_0 \quad (6)$$

the analog switches $S_1$ and $S_2$ are both turned off and consequently the resulting gain is driven by $$(dE_0/dE_i) = 1$$

Here, the gains in the above cases (4), (5) and (6) have a relation $$\frac{R_1//R_2}{R_i + R_1//R_2} < \frac{R_1}{R_i + R_1} < 1,$$

thus providing an input-output characteristic with a gradually increasing gain as shown in FIG. 6.

Also with the construction shown in FIG. 5, as is the case with the construction shown in FIG. 3, the output voltage $E_o$ has the same value of just prior to attaining and after attaining the reference voltage $V_1$. Thus, even if a load resistor is connected between the output terminals $P_2$ and $P_3$, the output voltage $E_o$ will not be changed in a step fashion.

We claim:

1. A non-linear operational circuit comprising:

an input resistor connected between an input terminal and an output terminal;

a switching circuit including a series circuit of a resistor, switching means and a reference voltage source connected between said output terminal and a ground terminal; and a comparator connected to said switching circuit, said comparator being adapted to receive as one input a voltage generated at said output terminal and as a reference input an output voltage of said reference voltage source for comparing the same with each other and opening or closing said switching means in accordance with the result of said comparison.

2. A non-linear operational circuit as claimed in claim 1, wherein said comparator connected to said switching circuit is adapted to close said switching means when the value of said reference voltage is higher than the value of said output terminal voltage.

3. A non-linear operational circuit as claimed in claim 1, wherein said comparator connected to said switching circuit is adapted to close said switching means when the value of said reference voltage is lower than the value of said output terminal voltage.

4. A non-linear operational circuit comprising:

an input resistor connected between an input terminal and an output terminal;

a plurality of switching circuits each thereof including a series circuit of a resistor, switching means and a reference voltage source connected between said output terminal and a ground terminal; and a plurality of comparators each thereof connected to each of said plurality of switching circuits respectively, each of said comparators being adapted to receive as one input a voltage generated at said output terminal and as a reference input an output voltage of said reference voltage source for comparing the same with each other and opening or closing said switching means in accordance with the result of said comparison.

* * * * *